United States Patent
Takeuchi et al.

(10) Patent No.: US 10,930,468 B2
(45) Date of Patent: Feb. 23, 2021

(54) CHARGED PARTICLE BEAM APPARATUS USING FOCUS EVALUATION VALUES FOR PATTERN LENGTH MEASUREMENT

(71) Applicant: Hitachi High-Tech Corporation, Tokyo (JP)

(72) Inventors: Hiroko Takeuchi, Tokyo (JP); Akemi Kondo, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/040,366

(22) Filed: Jul. 19, 2018

(65) Prior Publication Data
US 2019/0035596 A1 Jan. 31, 2019

(30) Foreign Application Priority Data

Jul. 27, 2017 (JP) ................................ 2017-145028

(51) Int. Cl.
*H01J 37/21* (2006.01)
*H01J 37/06* (2006.01)
(Continued)

(52) U.S. Cl.
CPC .............. *H01J 37/21* (2013.01); *G21K 1/087* (2013.01); *H01J 37/06* (2013.01); *H01J 37/28* (2013.01);
(Continued)

(58) Field of Classification Search
CPC .. H01J 37/21; H01J 37/28; H01J 37/06; H01J 2237/216; H01J 2237/221; H01J 37/10; G21K 1/087
See application file for complete search history.

(56) References Cited

U.S. PATENT DOCUMENTS 6,538,249 B1 * 3/2003 Takane .................. G06T 5/50
850/10
9,846,931 B2 * 12/2017 Toyoda ................ H01J 37/222
(Continued)

FOREIGN PATENT DOCUMENTS

JP 4-261743 A 9/1992
JP 2002-244029 A 8/2002
(Continued)

OTHER PUBLICATIONS

Klaus van Benthem, Andrew R. Lupini, Mark P. Oxley, Scott D. Findlay, Leslie J. Allen, Stephen J. Pennycook, Three-dimensional ADF imaging of individual atoms by through-focal series scanning transmission electron microscopy, Ultramicroscopy, vol. 106, Issues 11-12. Nov. 2006.*
(Continued)

*Primary Examiner* — Brooke Purinton
(74) *Attorney, Agent, or Firm* — Crowell & Moring LLP (57) ABSTRACT

An object of the invention is to provide a charged particle beam apparatus which improves an efficiency of a beam scan at the time of performing a focus adjustment and a measurement or an inspection based on a signal obtained by the beam scan. In order to achieve the object described above, there is proposed a charged particle beam apparatus including a lens which focuses a charged particle beam on a sample, wherein focus evaluation values of a plurality of images are calculated which are obtained under different focus conditions by the lens, the images which are obtained by beam radiation with different focus conditions and in which a predetermined condition is satisfied are subject to a processing according to the focus evaluation values, and an integrated image is generated by integrating the processed images subject to the processing according to the focus evaluation values.

7 Claims, 6 Drawing Sheets

(51) Int. Cl.
   *G21K 1/087* (2006.01)
   *H01J 37/28* (2006.01)
(52) U.S. Cl.
   CPC ... *H01J 2237/216* (2013.01); *H01J 2237/221* (2013.01)

(56) References Cited

U.S. PATENT DOCUMENTS

| | | | |
|---|---|---|---|
| 2005/0127293 A1* | 6/2005 | Kim | H01J 37/21 250/311 |
| 2007/0200947 A1 | 8/2007 | Kobaru et al. | |
| 2009/0206259 A1* | 8/2009 | Obara | H01J 37/21 250/311 |
| 2009/0272900 A1* | 11/2009 | Nir | H01J 37/21 250/307 |
| 2015/0002652 A1 | 1/2015 | Takasugi et al. | |
| 2015/0016709 A1 | 1/2015 | Toyoda et al. | |

FOREIGN PATENT DOCUMENTS

| | | |
|---|---|---|
| JP | 2005-175465 A | 6/2005 |
| JP | 2007-227207 A | 9/2007 |
| KR | 10-2014-0119097 A | 10/2014 |
| KR | 10-2014-0123535 A | 10/2014 |

OTHER PUBLICATIONS

Korean-language Office Action issued in Korean Application No. 10-2018-0082228 dated Jul. 17, 2019 (three (3) pages).
Korean-language Written Opinion issued in Korean Application No. 10-2018-0082228 dated Mar. 4, 2020 with English Translation (24 pages).

* cited by examiner

Fig. 6

CHARGED PARTICLE BEAM APPARATUS USING FOCUS EVALUATION VALUES FOR PATTERN LENGTH MEASUREMENT

CROSS-REFERENCE TO RELATED APPLICATION

This application claims the priority of Japanese Patent Application No. 2017-145028 filed Jul. 27, 2017, which is incorporated herein by reference in its entirety.

TECHNICAL FIELD

The present disclosure relates to a charged particle beam apparatus, and particularly to a charged particle beam apparatus which has an auto focusing function.

BACKGROUND ART

As a background art in this technical field, there is disclosed in JP-A-2002-244029 (PTL 1). A scanning electron microscope (SEM) which scans a wafer surface with an electron beam to measure a dimension of a pattern is used as one of devices used to control a semiconductor process. Currently, the scanning electron microscope is used to control a dimension in terms of measuring fine patterns with high accuracy. On the other hand, recently, higher throughput has been required for the scanning electron microscope which measures and inspects a semiconductor device. PTL 1 describes a method of finding a focus adjusting condition that is appropriate for the measured pattern based on a small number of acquired images for focus evaluation by performing the focus evaluation not in the entire visual field but in a narrow field. According to the method disclosed in PTL 1, the high throughput can be expected as the acquired image is smaller.

CITATION LIST

Patent Literature

PTL 1: JP-A-2002-244029

SUMMARY OF INVENTION

Technical Problem

In addition to the method disclosed in PTL 1, a pattern measurement device which uses the existing scanning electron microscope acquires a plurality of images for performing the focus evaluation, finds a proper focusing position based on the evaluation of the plurality of images, and performs a beam scan for measurement or inspection. That is, it is necessary to perform two beam scans, i.e. a beam scan for focus adjustment and a beam scan for the measurement or the inspection. The inventor newly comes up with a fact that the time required for the measurement or the inspection may be reduced by making the beam scan more efficient.

Hereinafter, a charged particle beam apparatus is proposed for the purpose of efficiency improvement of a beam scan at the time of performing focus adjustment and measurement or inspection based on a signal obtained by the beam scan.

Solution to Problem

As one aspect for achieving the object, a charged particle beam apparatus including a lens which focuses a charged particle beam emitted from a charged particle source on a sample, includes a control device which controls the lens. The control device calculates focus evaluation values of a plurality of images which are obtained under different focus conditions by the lens, performs a processing according to the focus evaluation values on the images which are obtained by beam radiation with different focus conditions and in which a predetermined condition is satisfied, and generates an integrated image by integrating the processed images subject to the processing according to the focus evaluation values.

Advantageous Effects of Invention

According to the configuration, the image used for the measurement or the inspection can be generated from the image for evaluating the focused state. Thus, it is possible to reduce the number of the beam scans required for the measurement or the inspection. As a result, it is possible to achieve acceleration of the measurement or the inspection.

DESCRIPTION OF EMBODIMENTS

In an embodiment which will be described below, a charged particle beam apparatus is described which has an automatic focus adjustment function. In addition, the charged particle beam apparatus which will be described below is controlled by a control device which includes a computer processor, and a non-temporal computer-readable medium. When executed by the computer processor, a non-temporal computer-readable medium controls the charged particle beam apparatus along a procedure to be described later by an encoded computer command to make a system controller execute a predetermined processing.

Typically, a focus automatic-adjusting function equipped in the charged particle beam apparatus evaluates a focused state (focus evaluation value) by using the image obtained by radiating the beam onto the length measuring target pattern. When the calculation of the focus evaluation value is performed on the images obtained in different focusing positions, the lens condition in which the focus evaluation value is largest is obtained by monitoring the change of the focus evaluation value with respect to the focusing position (lens condition). After the lens is adjusted again to have the condition obtained in the above manner, the image for length-measurement is acquired by radiating the beam on the length measuring target pattern. The length-measurement using the image in which a focus is set properly can be performed by performing the length-measurement through the above process. However, it is necessary to perform at least two beam scans which are the beam scan for obtaining the focus evaluation value and the beam scan for acquiring the image for length-measurement.

As a result of considering the above-described situation, the inventor realizes that the time required for the measurement or the inspection can be reduced by shortening the acquisition time of the image which is used for the measurement or the inspection.

Hereinafter, a charged particle beam apparatus in which the acceleration of throughput is achieved by reducing acquiring time of an image used for measurement or inspection will be described by using the drawings. Further, a charged particle beam apparatus in which accuracy can be increased will be described together.

In the embodiment described below, mainly, the charged particle beam apparatus includes a lens which focuses a charged particle beam emitted from a charged particle source on a sample. The charged particle beam apparatus includes: a control device which is capable of changing a condition of the lens stepwisely and determining a focus condition; and a detector which detects a charged particle which is obtained by radiating the charged particle beam on the sample. The charged particle beam apparatus includes an image processor which generates the image based on the image signal, calculates a focus evaluation value of the generated image, generates the weighted image based on the focus evaluation value, integrates the weighted image to generate an integrated image, and measures the length thereof.

According to the above configuration, it is possible to achieve acceleration and accuracy improvement of length-measurement or inspection using the charged particle beam apparatus.

Hereinafter, the description will be given about the embodiment relating to a scanning electron microscope which is one aspect of the charged particle beam apparatus. However, the invention is not limited thereto and may be applied to other charged particle beam apparatuses such as a focused ion beam (FIB) device or a scanning transmission electron microscope (STEM). Further, the invention may be applied to an optical device which generates an image from a signal obtained by radiating light. That is, the invention may be applied to general devices which perform focus adjustment from the acquired image.

Figure 1:
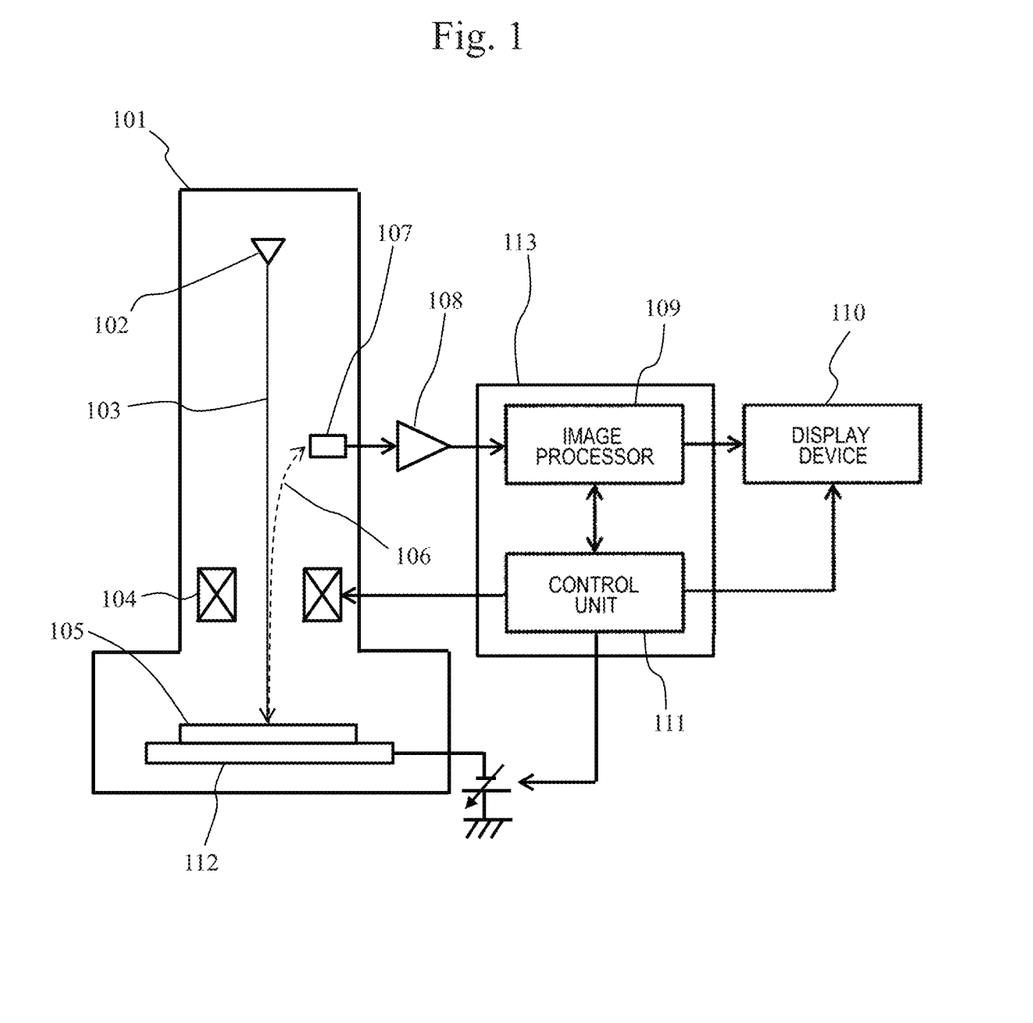
FIG. 1 is a view illustrating an outline of a scanning electron microscope.

FIG. 1 is a schematic view of a configuration of the scanning electron microscope. The reference numeral 101 indicates a mirror unit of the scanning electron microscope. An electron beam 103 emitted from an electron gun 102 is converged by an electron lens (not illustrated), and further is focused by an object lens 104 to be radiated on a sample surface 105. An image signal 106 (secondary electrons or backscattered electrons) generated from the sample by radiating the beam is detected by a detector 107, and is amplified by an amplifier 108. The amplified image signal is analog/digital-converted by an image processor 109 in the control device 113 and is synchronized with the scan signal to be stored in a frame memory, whereby a digital image is generated. When the digital image is generated, the image processing and the image evaluation are performed in the image processor. The reference numeral 110 indicates a display device which displays the digital image generated by the image processor.

The automatic focus adjustment is performed by using the object lens 104. In addition, the automatic focus adjustment may be performed by using the electrostatic lens formed by applying a negative voltage to the sample. In this embodiment, a stage 112 is adopted in which a retarding voltage can be applied. In the focus adjustment (retarding focus) using the electrostatic lens, a relatively fine adjustment of the focusing position can be performed compared to the focus adjustment using an electromagnetic lens. In this embodiment, when at least one of the excitation current supplied to the object lens 104 or the applied voltage to the stage 112 is controlled by a control unit 111, the focusing position is changed stepwisely to execute the automatic focus adjustment.

Figure 2:
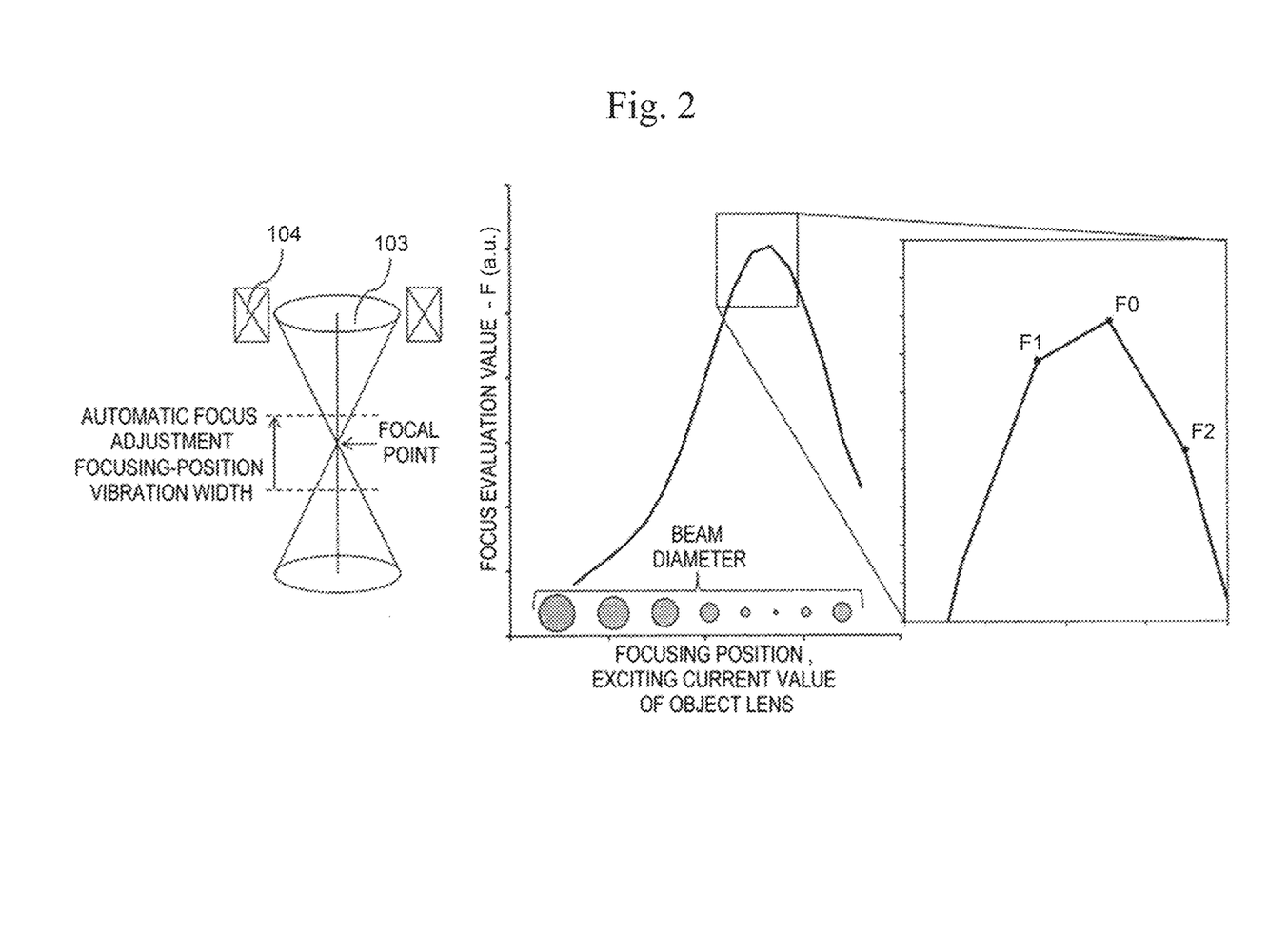
FIG. 2 is a view illustrating a relation among a probe diameter, a focusing position, and a focus evaluation value (F) in a beam at the time of performing automatic focus adjustment.

FIG. 2 illustrates a relation among a beam diameter of an electron beam at the time of the automatic focus adjustment, the focusing position, and the focus evaluation value (F). The electron beam (103) is converged by the object lens (104) to be focused in a certain position. When the focusing position is below the sample surface, the beam spot diameter on the surface is widened (underfocus). As the focus approaches the surface from the underfocus state, the spot diameter becomes shortened, and the spot diameter becomes minimum on the surface, whereby the image of the focal point can be acquired (just focus). In a case where the focusing position is above the sample surface, the beam becomes in a so-called overfocus state in which the lens conditions are too strong.

When the focusing position is deviated from the focal point, and the spot diameter is formed widely, the focus evaluation value of the image at that time becomes low. When the spot diameter is small, in the captured image, the focus evaluation value becomes high. In the automatic focus adjustment, the images are acquired while variating the focusing position, and the focusing position in which the focus evaluation value of the image is maximum and exciting current value of an object lens (or the applied voltage to the stage) at that time are decided.

Figure 3:
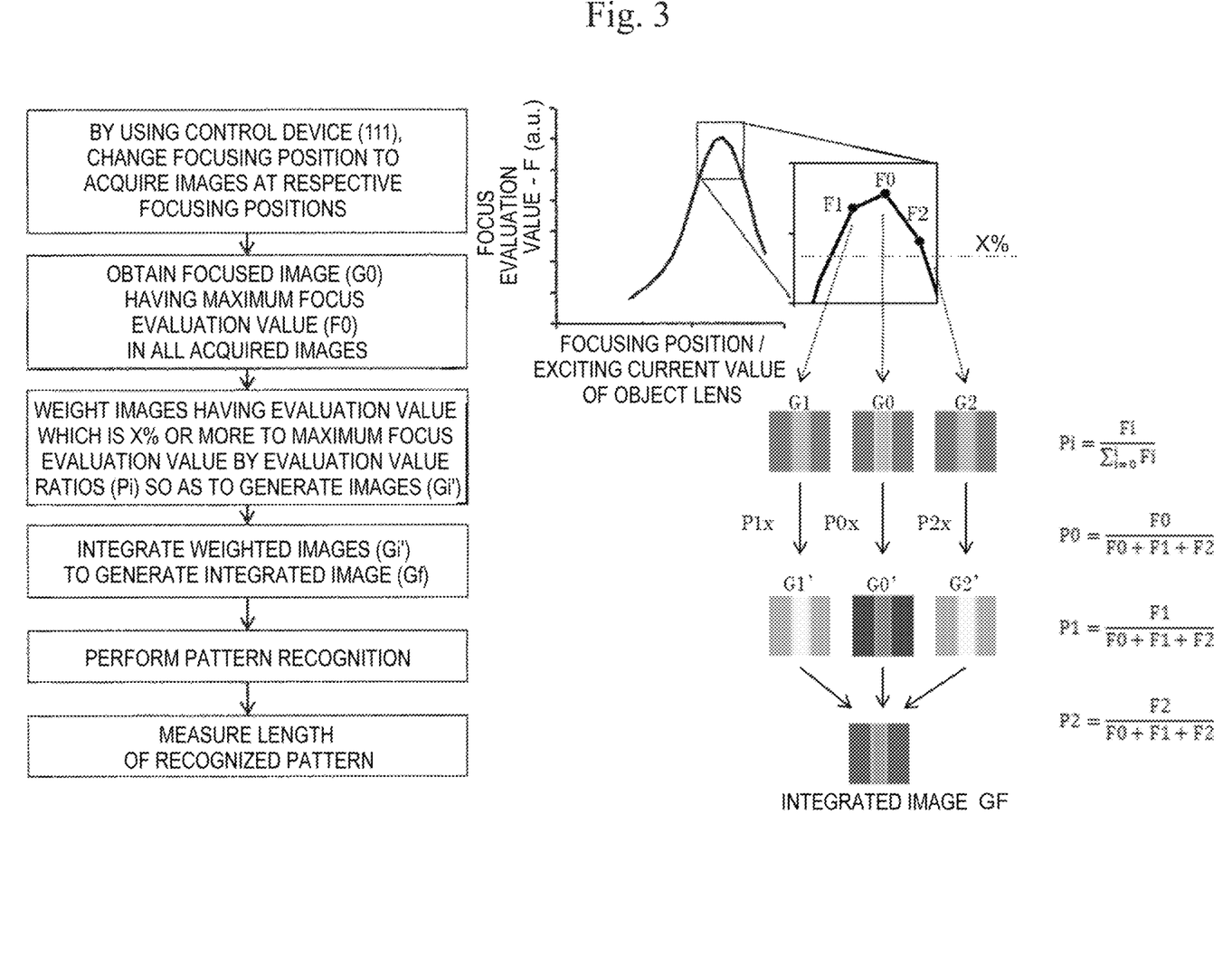
FIG. 3 is a flowchart illustrating a high-speed weighted image integration procedure.

FIG. 3 describes details of a method of performing the length-measurement by using the image generated during the automatic focus adjustment by the control unit 111. First, as conditions, a place where the automatic focus adjustment is performed is set to the place of the pattern to be length-measured, and a magnification is specified to the magnification at the time of length-measurement. The control unit 111 variates the focusing position of the electron beam passing through the object lens 104 at each of predetermined step widths to capture a focus evaluation image. The focus evaluation values (Fi) of all the images captured while variating the focusing position are calculated to decide a focused image (G0) indicating a maximum focus evaluation value (F0). The images having the evaluation values which are a fixed proportion (X %) or more with respect to a maximum focus evaluation value are weighted by respective evaluation value ratios (Pi) so as to generate an image (Gi'). The evaluation ratio (Pi) is calculated by using a following expression.

$$Pi = Fi \div (\Sigma F0 + F1 + \ldots + Fi) \quad \text{Expression (1)}$$

As exemplarily illustrated on the right side of FIG. 3, in a case where the images having an evaluation value of X % or more (a threshold value or more obtained by the calculation) are three pieces, the respective evaluation ratios (Pi) are obtained as follows.

$$P0 = F0 \div (F0 + F1 + F2) \quad \text{Expression (2)}$$

$$P1 = F1 \div (F0 + F1 + F2) \quad \text{Expression (3)}$$

$$P2 = F2 \div (F0 + F1 + F2) \quad \text{Expression (4)}$$

Next, all the weighted images (Gi') are integrated to generate an integrated image (Gf). Accordingly, an S/N ratio is not sufficient only in the focused image, and it is possible to avoid the pattern recognition error at the time of the length-measurement. The pattern recognition is performed on the integrated image (Gf) to measure the length of the recognized pattern.

As described above, a plurality of images in which a focusing position is different and a predetermined condition is satisfied (for example, the focus evaluation value is X % or more) are subject to the processing according to the focus evaluation value (for example, weighting according to the focus evaluation value), and then the integration is performed on the images. Thus, the images used for the focus evaluation can be used for the length-measurement. When the images used for the focus evaluation are also used for the length-measurement, it is possible to improve the efficiency of the beam radiating process. As a result, it is possible to reduce a processing time required for the measurement and the inspection.

The focus evaluation value is an index value which indicates the sharpness of the image, for example. The focus evaluation value becomes higher as the sharpness is higher. The image processor 109 calculates the focus evaluation value in each of the focusing positions (lens conditions) and obtains the focusing position in which the focus evaluation value is maximum by generating relational information between the focus evaluation value and the focusing position as exemplarily illustrated in FIG. 2.

The description will be given about an application example of the method of weighting and integrating for the measurement with high accuracy. The length-measurement images are captured according to the focusing positions (the excitation current value of the object lens and the applied voltage to the stage) obtained by the automatic focus adjustment. However, the focusing position cannot be always reproduced, and unevenness may occur. In other words, in the focus automatic-adjusting function, the focusing position is hardly reproduced equally at all the times, and may be deviated from the focal point position. That is, the focusing position aligned by the focus automatic adjustment may not be positioned in a right focal position. Thus, in order to improve the accuracy of the length-measurement, it is desirable to acquire the image in the focal position with high repeatability and measure the length thereof. In this regard, in order to achieve the measurement with high accuracy, a plurality of images captured while displacing the focusing position are used to generate an image, thereby preventing the unevenness, which occurs when the images are acquired at a single focusing position, of the focusing position between different measurement processings. In this regard, the application of the method of weighting and integrating is proposed in order to maintain the length-measurement with high accuracy.

Figure 4:
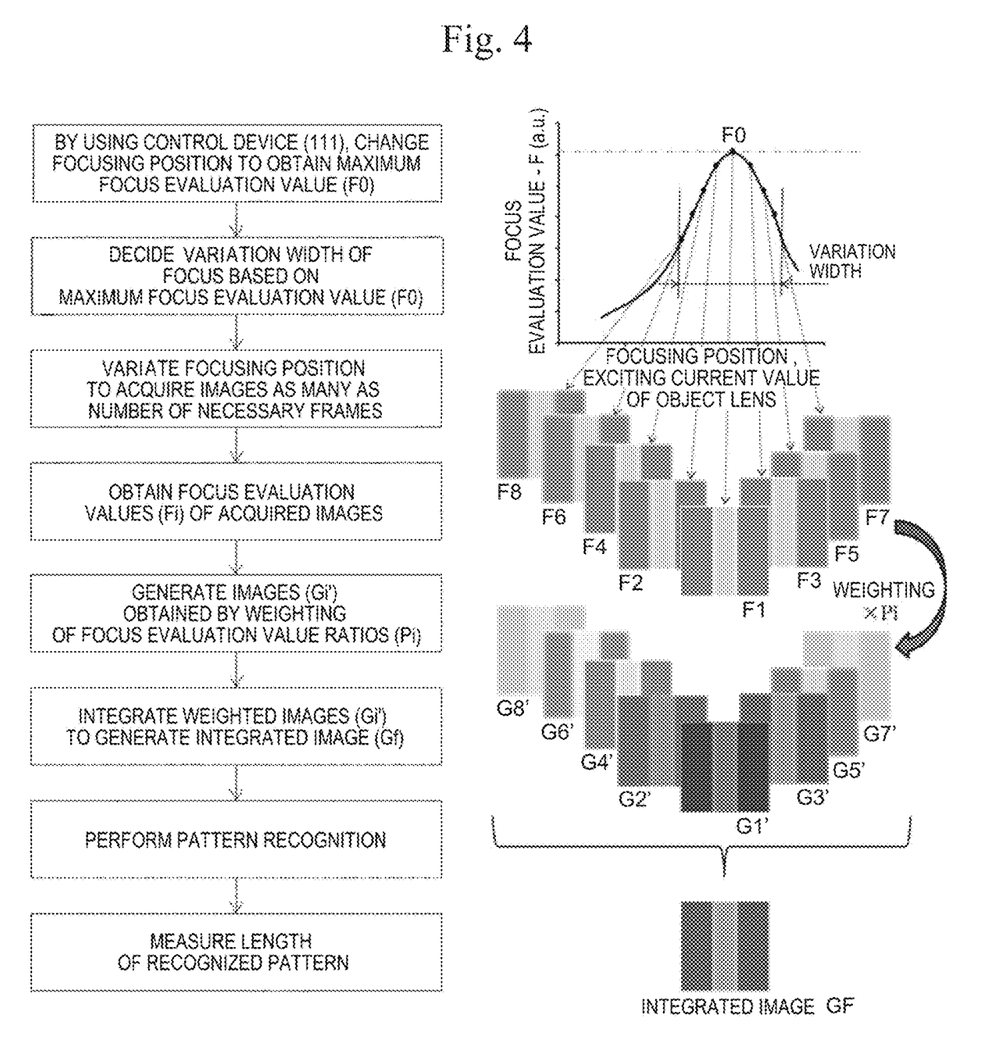
FIG. 4 is a flowchart illustrating a high-accuracy weighted image integration procedure.

FIG. 4 is a flowchart for explaining a processing of weighing and image-integrating which enables the length-measurement with high accuracy and one embodiment thereof. First, the automatic focus adjustment is performed to obtain the maximum focus evaluation value (F0). The variation width of the focusing position at the time of capturing is set with the maximum focus evaluation value (F0) thereof as a reference. The variation width is set to a proper value in consideration of the unevenness of the focusing position. The variation width of the focusing position is divided as many as the number of the necessary integration frames, and the length-measurement images are captured in one frame at respective focusing positions (lens conditions). The number of the necessary frames or the variation width (the adjusting range of the lens) is input in advance from an input device (not illustrated), for example. The division with (division number) may be obtained in advance therefrom.

The focus evaluation values (Fi) of the acquired images are obtained. The evaluation value ratios (Pi) are calculated based on the evaluation values by using the expression (1), and the images are weighted by Pi to generate the weighted images (Gi'). Finally, the generate images (Gi') are integrated, and the integrated image (Gf) is used to perform the pattern recognition and the length-measurement.

As described above, a plurality of images in which a focusing position is different and a predetermined condition is satisfied (which are acquired by the lens conditions within a predetermined amplitude of the lens conditions centered on the maximum focus evaluation value, for example) are subject to the processing according to the focus evaluation value (for example, weighting according to the focus evaluation value), and then the integration is performed on the images. Thus, although the maximum focusing position is deviated, the focuses of the images acquired while displacing the focusing position are aligned so that the proportion of the focused image is increased to enable the length-measurement with high accuracy.

Next, the description will be given about another example in which in a case where the number of the frames for generating the integrated image is decided in advance, the image acquisition processing is made efficient while the scanning is performed as many as the number of the frames. The image integration is a technique that increases the S/N ratio by integrating (averaging) the images obtained by plural times of scans (plural frames). The S/N ratio is increased as the number of the integration increases. However, since the processing time is increased and the sample electrification becomes large, it is necessary to set the proper number of the frames in order to prevent the influence thereof and perform the measurement with high accuracy. In addition, in a case where fixed point observation is performed on a specified pattern of a plurality of semiconductor wafers in order to monitor the change of the process condition of the semiconductor device, when the device condition is changed at each of the measurements, the process change cannot be evaluated properly. In consideration of the above point, it is desirable to fix the condition such as the number of the frames.

Figure 5:
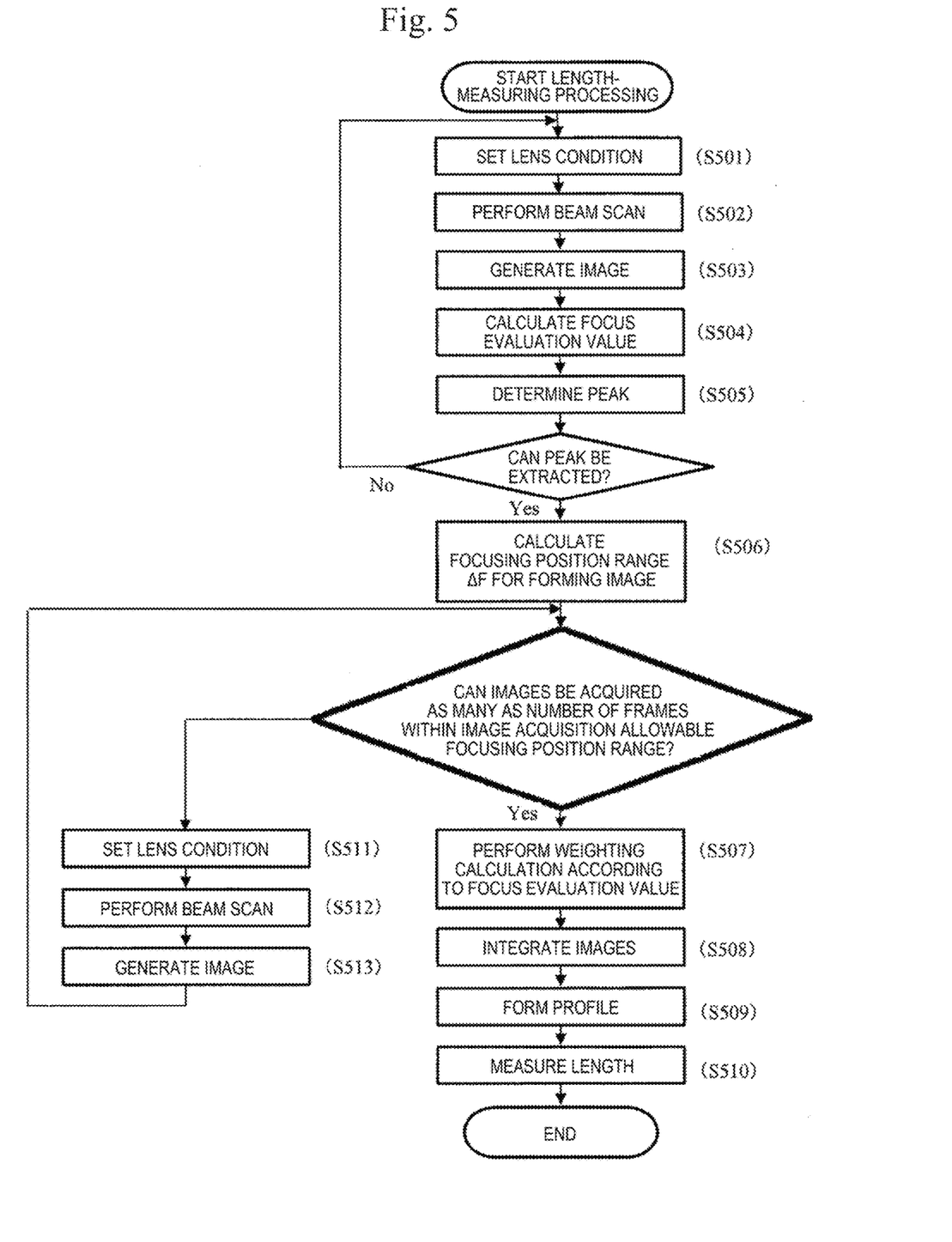
FIG. 5 is a flowchart illustrating a process which generates an image for length-measurement from an image for focus evaluation.

In this regard, an example in which the image acquisition processing is made efficient in a case where the images are acquired as many as a predetermined number (four in the following description) of the frames as below is described by using FIG. 5. The control unit 111 controls the components of the scanning electron microscope according to the process exemplarily illustrated in FIG. 5.

First, the object lens 104 is set to an initial condition (S501). The initial condition is a lens condition which is set based on the height measurement of the wafer using a Z sensor (not illustrated) (the height measurement device of the wafer surface), for example. A control signal (such as an excitation current) which is supplied to a lens is controlled such that the focusing position is located at a position where the focusing position may be substantially underfocused. Next, the beam scan is performed in the state, and the image is generated (S502 and S503). The generated image is stored in the frame memory to perform the following weighting and the integration.

Next, the sharpness evaluation or the like is performed on the generated image, so as to calculate the focus evaluation value (S504). The focus evaluation value obtained herein is plotted (point 601) to a graph which indicates a relation between the focus evaluation value and the lens conditions as exemplarily illustrated in FIG. 6. The processing of S501 to S505 is performed while changing the lens conditions at each of predetermined values, thereby extracting the point 602 (peak). Whether the focus evaluation value reaches the peak can be understood only after the focus evaluation value starts to decrease. Thus, in the case of this embodiment, when the two points in which the focus evaluation value is below the virtual peak point are present consecutively from a virtual peak point (for example, when the point 603 is present), the virtual peak is decided such that the defined point 602 is a right peak. The procedure proceeds to a next process.

Figure 6:
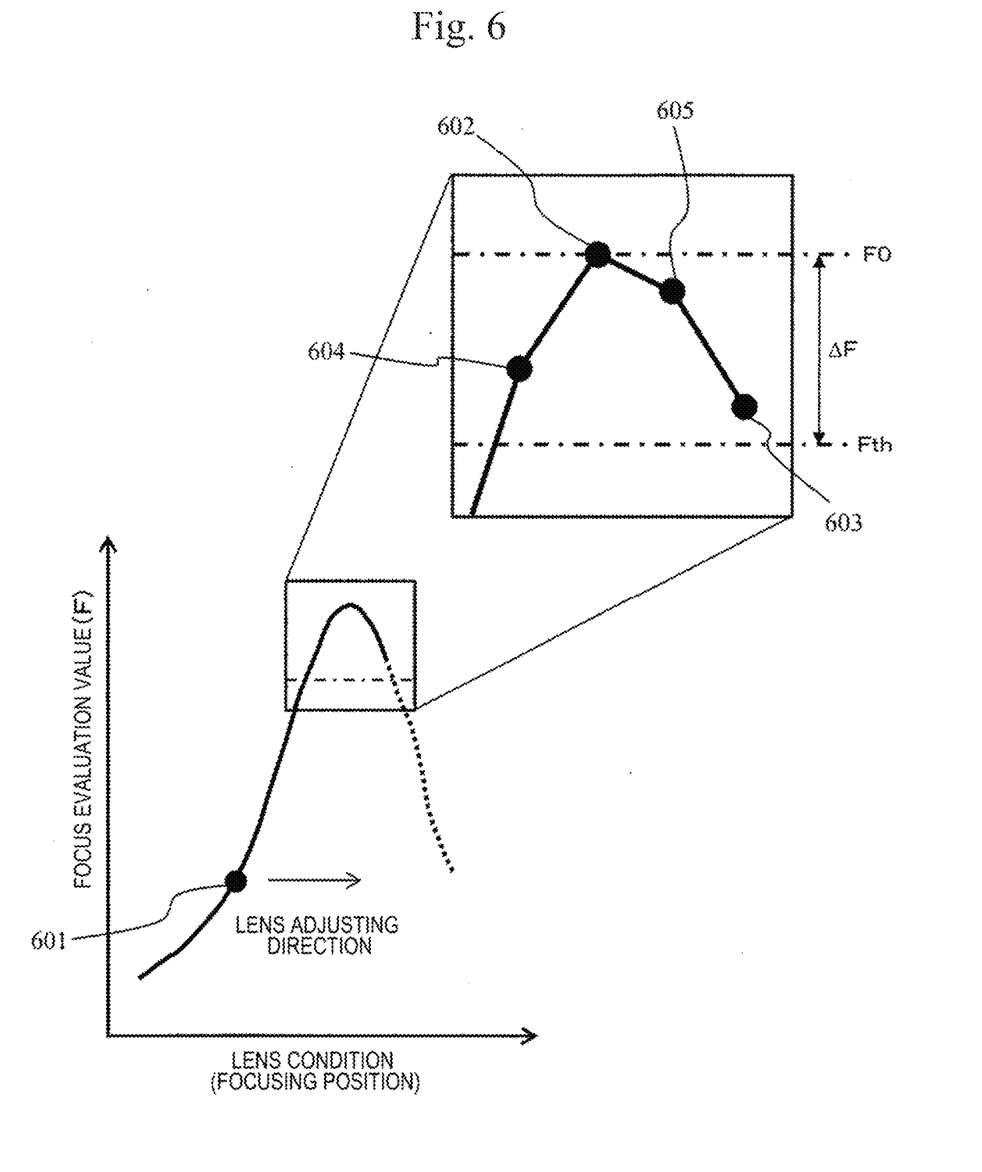
FIG. 6 is a view illustrating a relation between the focus evaluation value and a lens condition.

The image processor 109 obtains a lower limit value (threshold value) Fth of the image acquisition allowable focusing position range ΔF by multiplying the focus evaluation value F0 of the peak 602 by X (X is a number smaller than 1) (S506). Herein, it is determined whether the image signals can be acquired as many as the predetermined number of the frames within the range of ΔF. In a case where it is determined that the acquisition is possible, the procedure proceeds to step 507. In a case where it is determined that the acquisition is not possible, the procedure proceeds to step 511. In the case of this example, the number of the necessary frames is set to 4, and four points of 602 to 605 are present within ΔF. Thus, in the case, the necessary image can be acquired, and the procedure shifts to an image generating step.

On the other hand, in a case where the number of the points included in ΔF is lower than "n" although the number of the necessary frames is set to "n", for example, the lens condition is set to a lens condition corresponding to the point 602, and the beam scan and the image generation are performed to acquire the signals as many as the number of the necessary n frames (S511 to 513). Incidentally, in a case where the number of the points included in ΔF is more than "n", the n frames which have a high focus evaluation value may be selected thereamong to perform the image integration (to be described later).

The processing such as ending the image acquisition process for the focus evaluation is performed based on the comparative determination between the number of the frames acquired in real time as above and the necessary number. Thus, the image acquisition processing can be minimized (it is not necessary to perform the focus adjustment to the dotted line portion of FIG. 6). As a result, it is possible to improve the measurement and the throughput of the inspection device.

The image processor 109 performs the weighting calculation (S507) exemplarily illustrated in FIG. 3 on the signals corresponding to the n frames obtained as above and then integrates the signals to generate the integrated image (S508). In this manner, the image used for the measurement and the inspection is generated from the signal acquired for the focus evaluation, and a luminance profile is formed from the image. The luminance profile is used to execute the length-measurement of the pattern included in the integrated image (S509 and S510). The luminance profile is a waveform signal which indicates the change of the luminance in a one-dimensional direction of the image. The dimension measurement of the pattern width is executed by measuring the dimension between low-luminance portions (peaks) of the waveform signal.

As described above, when the image acquisition of the measurement processing or the image acquisition for the focus evaluation is made efficient, it is possible to reduce the processing time of the measurement and the inspection included in the focus adjustment. As a result, it is possible to achieve the high throughput of the apparatus.

REFERENCE SIGNS LIST

101: mirror unit of scanning electron microscope
102: electron gun
103: electron beam
104: object lens
105: sample
106: image signal
107: detector
108: amplifier
109: image processor
110: display device
111: control unit
112: stage
113: control device

The invention claimed is:

1. A charged particle beam apparatus including a lens which focuses a charged particle beam emitted from a charged particle source on a sample, the apparatus comprising:
a control device which controls the lens,
wherein the control device calculates focus evaluation values of a plurality of images which are obtained under different focus conditions by the lens,
wherein the control device calculates a maximum value among the calculated focus evaluation values,
wherein the control device divides, by a predetermined number of frames necessary for generating an integrated image, a variation width of a focusing position of the charged particle beam which is set based on the maximum value of the focus evaluation values,
wherein the control device captures a plurality of one frame images according to a setting of a lens condition corresponding to the divided range,
wherein the control device calculates the focus evaluation values of the plurality of one frame images,
wherein the control device performs a weighting operation on the plurality of one frame images based on the focus evaluation values of the plurality of one frame images,
wherein the control device generates the integrated image by integrating the weighted images, and
wherein the control device measures a size of a pattern included in the integrated image.

2. The charged particle beam apparatus according to claim 1,
wherein the focus evaluation values at the time of acquiring an image are a predetermined threshold value or more.

3. The charged particle beam apparatus according to claim 2,
wherein the control device obtains the maximum value of the focus evaluation values based on calculation of the focus evaluation values of the plurality of images obtained under the different focus conditions, and
wherein the control device calculates the threshold value by multiplying the maximum value by a predetermined coefficient.

4. A charged particle beam apparatus including a lens which focuses a charged particle beam emitted from a charged particle source on a sample, the apparatus comprising:

a control device which is capable of changing a condition of the lens stepwisely and determining a focus condition; and a detector which detects a charged particle which is obtained by radiating the charged particle beam on the sample, wherein the control device generates one frame images at each condition of the stepwisely changed lens condition based on an image signal detected by the detector, wherein the control device calculates focus evaluation values of the generated one frame images, wherein the control device calculates a maximum value among a plurality of the calculated focus evaluation values, wherein the control device divides, by a predetermined number of frames necessary for generating an integrated image, a variation width of a focusing position of the charged particle beam which is set based on the maximum value of the focus evaluation values, wherein the control device generates, for the one frame images that are acquired based on a setting of the lens condition corresponding to the divided range, weighted images based on the focus evaluation values, wherein the control device integrates the weighted images to generate the integrated image, and wherein the control device measures a dimension of a pattern included in the integrated image.

5. A charged particle beam apparatus including a lens which focuses a charged particle beam emitted from a charged particle source on a sample, the apparatus comprising:

a control device which is capable of changing a condition of the lens stepwisely and determining a focused lens condition; and a detector which detects a charged particle which is obtained by radiating the charged particle beam on the sample, wherein the control device generates a plurality of one frame images based on image signals detected by the detector, wherein the control device calculates focus evaluation values of the generated one frame images, wherein the control device determines the focused lens condition according to the focus evaluation values, wherein the control device divides, by a predetermined number of frames necessary for generating an integrated image, a variation width of a focusing position of the charged particle beam which is set based on the focused lens condition, wherein the control device performs, according to the focus evaluation values, a weighting operation on the one frame images that are acquired according to a setting of a lens condition corresponding to the divided range, wherein the control device generates the integrated image by integrating the images weighted according to the focus evaluation values, and wherein the control device measures a dimension of a pattern included in the integrated image.

6. The charged particle apparatus according to claim 4, wherein, after calculating the maximum value, the control device stops stepwisely changing the lens condition.

7. The charged particle apparatus according to claim 5, wherein, after determining the focused lens condition, the control device stops stepwisely changing the lens condition.

* * * * *